United States Patent [19]

Chang

[11] Patent Number: 5,051,829

[45] Date of Patent: Sep. 24, 1991

[54] METHOD FOR AUTOMATICALLY CONTROLLING OPTIMAL TUNING POINT FOR RECEIVING TELETEXT

[75] Inventor: Dong H. Chang, Gumi, Rep. of Korea

[73] Assignee: Goldstar Co., Ltd., Rep. of Korea

[21] Appl. No.: 512,123

[22] Filed: Apr. 20, 1990

[30] Foreign Application Priority Data

Apr. 28, 1989 [KR] Rep. of Korea ................. 5672/1989

[51] Int. Cl.⁵ ............................................ H04N 7/087
[52] U.S. Cl. ................................................ 358/191.1
[58] Field of Search ............ 358/142, 146, 147, 191.1, 358/193.1

[56] References Cited

U.S. PATENT DOCUMENTS 4,360,832 11/1982 Rzeszewski ..................... 358/191.1

Primary Examiner—John W. Shepperd
Attorney, Agent, or Firm—Anthony J. Casella; Gerald E. Hespos

[57] ABSTRACT

Method for automatically controlling the optimal tuning point for receiving teletext increases or decreases the tuning point of steps of a certain frequency for the byte error at each step tuning point to be detected and memorized so that the tuning point for the minimal byte error is found to provide the optimal tuning frequency for receiving a teletext, thus eliminating the inconvenience of manipulating a key to find the optimal tuning point from the display on a TV screen. The system of the method employs a microprocessor and teletext processor in addition to the tuner.

1 Claim, 3 Drawing Sheets

METHOD FOR AUTOMATICALLY CONTROLLING OPTIMAL TUNING POINT FOR RECEIVING TELETEXT

BRIEF SUMMARY OF INVENTION

This invention relates to a method for automatically controlling the optimal tuning point for receiving broadcast teletext, in particular, a method in that the tuning point is increased or decreased by certain steps for the byte error at each step tuning point to be detected and memorized so as to find the tuning point for the minimum byte errors and memorize it for providing the optimum tuning frequency for teletext receiving.

Heretofore, the user desiring a teletext service has been using a closely controllable Up/Down key to bring up or down the tuning point and visually confirming the number of byte errors from the display on a television screen to select the tuning point for receiving the broadcast teletext.

The conventional system, however, has a disadvantage of spending much time to determine the optimum tuning point for receiving broadcast teletext in addition to the inconvenience of complicated processes. Further, the method for visually determining a tuning point by means of manipulating a closely controllable Up/Down key results in imprecision in determining the optimal tuning point. Without setting a tuning point for teletext receiving the teletext service becomes impossible to obtain, let alone the quality desired of screen display. The number of errors per 1000 bytes must be less than 5.

The present invention, therefore, is designed to eliminate the above stated disadvantages and provides the optimum tuning point automatically by the input of an optimum tuning point memory key.

Figure 1:
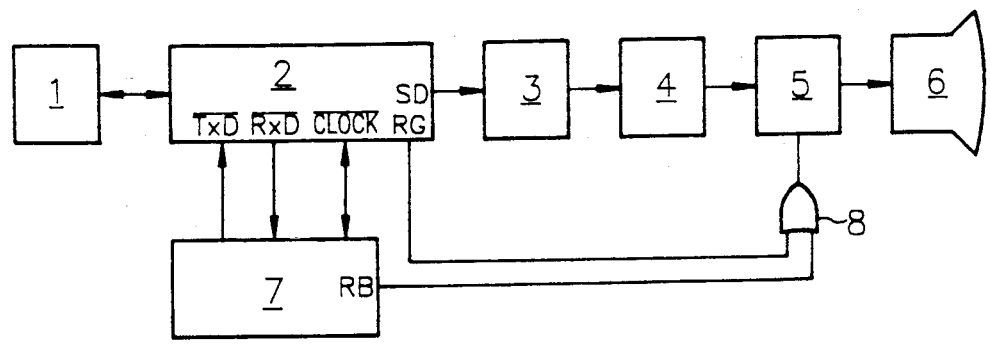
FIG. 1 shows a block diagram of an automatic optimum tuning point control system for receiving teletext on a television receiver according to the invention.

Numerals in the drawings indicate the following;

Numeral indicating a key matrix section, 2 a microprocessor, 3 a tuner, 4 an image signal processor, 5 an image signal switching section, 6 a CRT, 7 a teletext processor, 8 an OR Gate.

DETAILED DESCRIPTION

With reference to the drawings, the invention shall be described in details. According to the construction of the block diagram shown in FIG. 1, a microprocessor 2 which controls the operation of the whole system under the output signal of a key matrix section applies channel selection data SD through a tuner 3 to an image signal processor 4, as input Vi, whose output Vo applies through an image signal (R, G, B) switching section 5 to a CRT 6, while the output RG of a microprocessor 2 and the output RB of a teletext processor 7 apply via an OR Gate 8 to an image signal switching section 5. The microprocessor 2 and the teletext processor 7 connect to each other with T×D (Transmit Serial Date), R×D (Receive Serial Data) and CLOCK for serial data mutual transmission.

Figure 3:
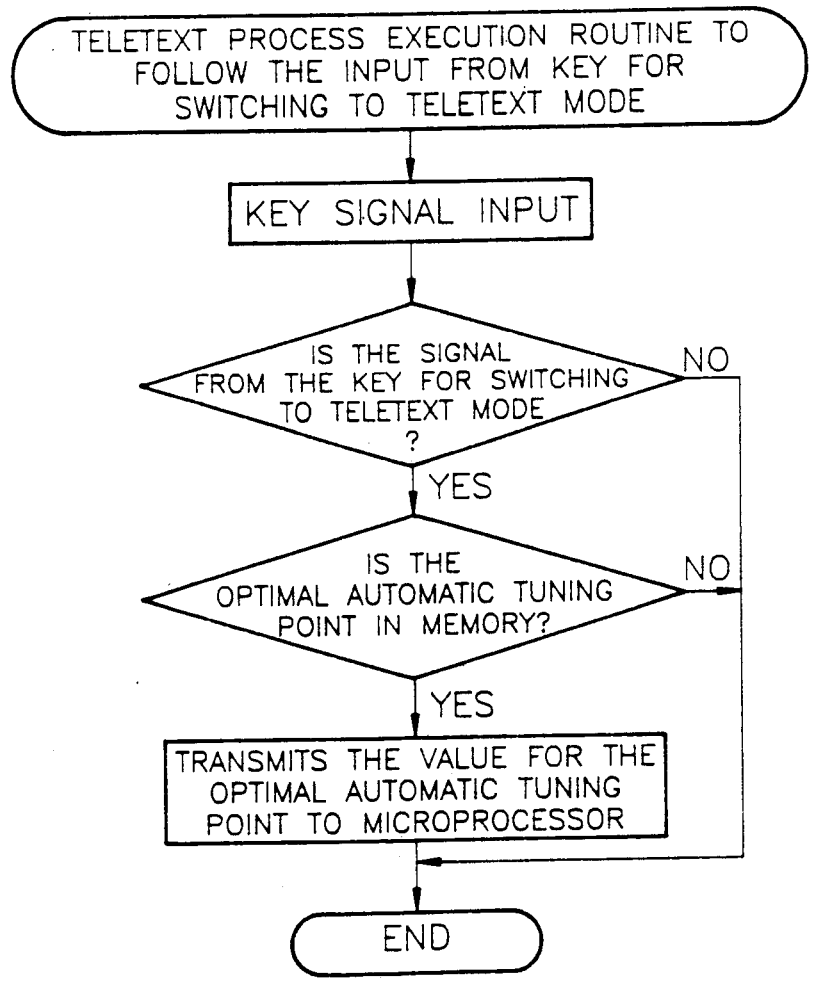
FIG. 3. shows an operational flow sheet of a teletext processor with an input of the teletext mode switch key according to the invention.
Figure 2A:
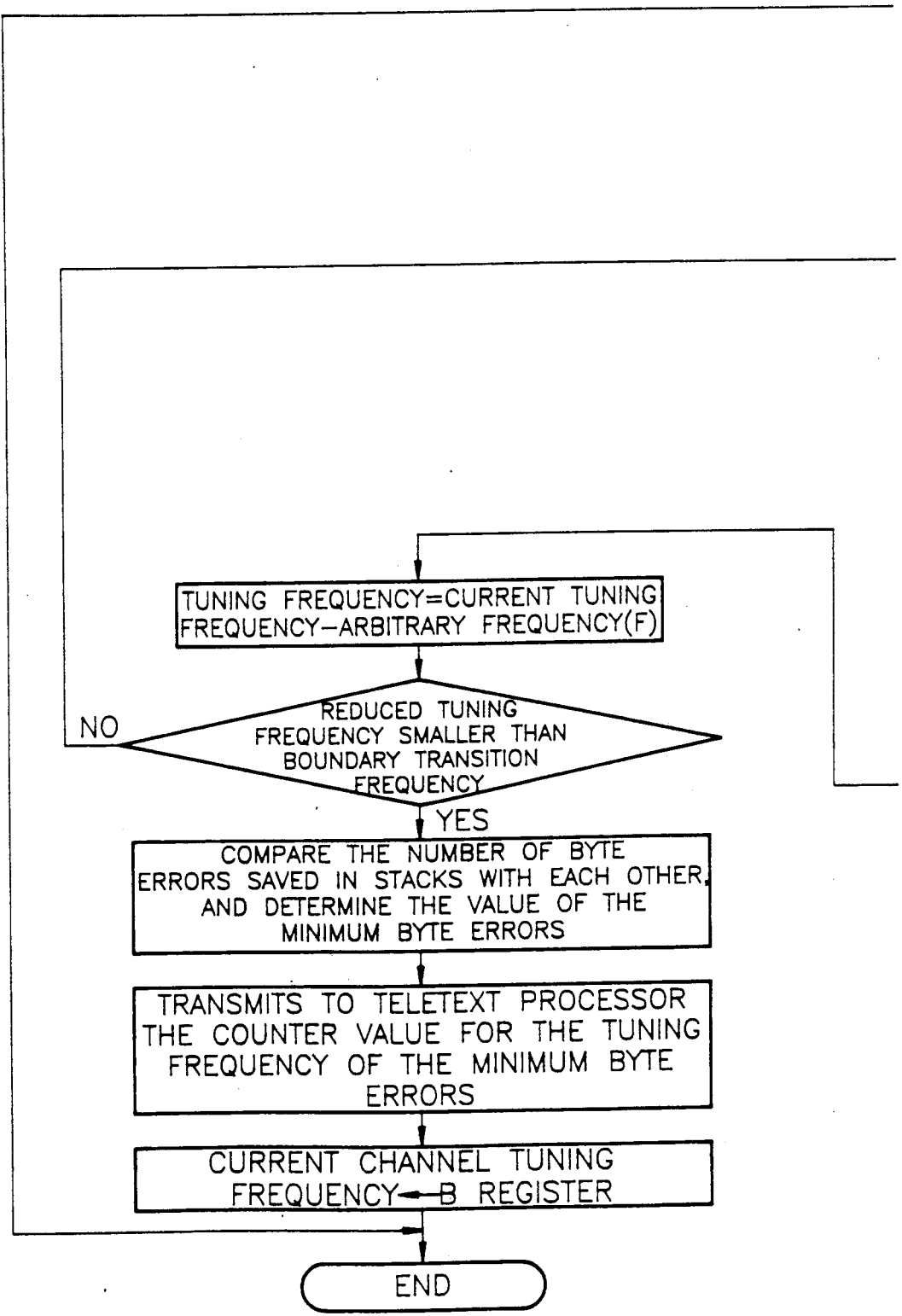
FIGS. 2A and 2B show an operational flow sheet of an automatic optimal tuning point control system of the invention.
Figure 2B:
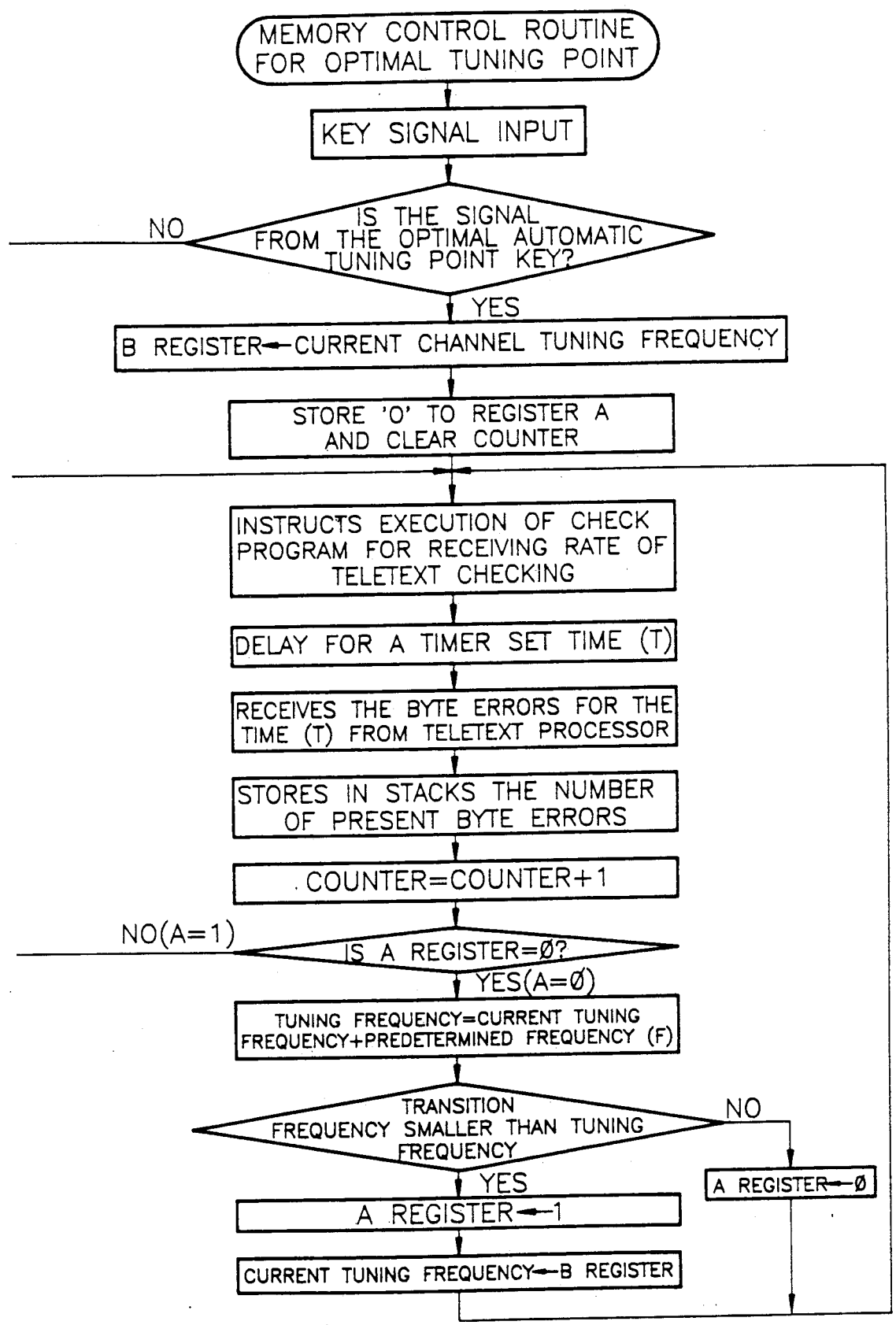

Referring to FIGS. 2 and 3, the operation of the invention shall be described in detail, as follows. Being applied with a signal on pressing a memory key of the automatic optimal tuning point on the key matrix section, the microprocessor 2 determines whether or not the signal comes from the memory key of the automatic optimal tuning point. If the signal is from the memory key for the optimal tuning point, register A stores the current tuning frequency to memorize the current channel tuning point and the register A stores '0' and clears the counter to apply R×D and CLOCK signals for the teletext processor 7 to execute a check program (byte error detection routine) for checking the teletext receiving rate. The microprocessor 2 then delays for a time T to receive from the processor 7 the input number of byte errors T×D stored for the time T as the result of executing the check program for teletext receiving rate and (according to the CLOCK signals) stores the current counter value and the number of byte errors in stacks (memory) and adds '1' to the current value of the counter.

Thereafter, the value of the register A is determined to be '0' or not. If the value is '0', the current tuning frequency is added with a frequency in steps to achieve a new current tuning frequency. When the added current tuning frequency does not exceed a boundary frequency 0 of predetermined setting, the register A stores '0' and the microprocessor 2 instructs the teletext processor 7 to execute the check program for receiving rate and repeat the process of detecting and memorizing the value of byte errors per step for the corresponding tuning frequencies increased by step-by-step method.

If the added current tuning frequency exceeds the boundary frequency 0 of predetermined setting, then the register A is set to 1 and the original tuning frequency (the valve of register B) is stored as the current turning frequency for the microprocessor 2 to instruct through R×D and CLOCK to the teletext processor to execute the check program for the receiving. Thereafter, the process of detecting and memorizing the value of byte errors per step for the corresponding tuning frequencies increased by the step-by-step method is repeated. Also, when the microprocessor 2 determines the value of the register A to be '1', then the current tuning frequency is reduced by the predetermined frequency and the decreased current tuning frequency is stored as the value of a current tuning frequency. When the reduced current tuning frequency does not exceed the boundary frequency '1' of predetermined setting, then the process of detecting and memorizing the number of byte errors per step is repeated for the tuning frequencies reduced by the step-by-step method.

However, when the reduced current tuning frequency exceeds the predetermined boundary frequency '1' then the minimum number of byte errors saved on the stacks is selected and the corresponding current tuning frequency is calculated and transmitted to the teletext processor 7. Upon executing the above process, the microprocessor 2 makes the value of the register B to be memorized as the current tuning frequency and transmits the value of the tuning frequency to the tuner 3.

According to the subroutine of the teletext processor 7 operating on input of the teletext mode switch key, as shown in FIG. 3, the microprocessor 2 upon receiving an input for switching from TV mode to teletext mode by a key of the key matrix section 1 transmits the signal from the key to the teletext processor 7, which finds the memory for the automatic optimal tuning point following the input signal of the switch key and, if found, transmits the memory found to the microprocessor 2. Thus, a teletext service is provided for a viewer with the setting of the optimal tuning frequency.

The present invention stores the optimal tuning frequency for receiving a teletext to eliminate the inconvenience of finding the optimal frequency, and it also provides accurate tuning frequencies for teletext receiving to enhance the reliability of the current teletext service.

What is claimed is:

1. A method of controlling a teletext processor to adjust the optimal tuning point for receiving a teletext signal, the method using a system including a key matrix, a microprocessor, a teletext processor, a tuner, an image processor, and image signal switching sections, the method comprising the steps of:

a) checking whether or not a signal input is from the key matrix for storing automatically the optimal teletext tuning point, and if said signal is for receiving automatically said optimal teletext tuning point, then the current channel tuning frequency is stored to a register B and '0' is stored to a register A, and a counter of the system is made clear;
   b) waiting for a predetermined time (T), so that thereafter, the number of byte error is received from teletext processor and stored to a stack, and the counter is increased by "1", wherein said number of byte errors is counted for said time (T) during the execution of a check program for checking the teletext receiving rate;
   checking whether or not register A is '0' so that if A is not '0', then the current tuning frequency is decreased by a predetermined frequency;
   d) checking whether or not the decreased current tuning frequency is less than the predetermined lower boundary frequency so that if less than the predetermined lower boundary frequency, after then the numbers of byte error stored in said stacks are compared with each other, the minimum number of byte errors is selected and the tuning frequency corresponding to said minimum number of byte errors is transmitted to the teletext processor and if not less than the predetermined lower boundary frequency, then the step (B) is returned;
   e) if said register A is '0', then the current tuning frequency is increased by said predetermined frequency;
   f) checking whether or not said increased current frequency is larger than the predetermined upper boundary frequency so that if larger, then '1' is stored to said register A and the current tuning frequency becomes the value of said register B, otherwise '0' is stored to register A and step b is returned to.

* * * * *